(12) United States Patent
Pawlak

(10) Patent No.: US 9,653,593 B2
(45) Date of Patent: May 16, 2017

(54) METHOD OF FABRICATING FINFET DEVICE AND STRUCTURE THEREOF

(71) Applicant: Taiwan Semiconductor Manufacturing Company, Ltd., Hsin-Chu (TW)

(72) Inventor: Bartlomiej Jan Pawlak, Heverlee (BE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 125 days.

(21) Appl. No.: 13/745,521

(22) Filed: Jan. 18, 2013

(65) Prior Publication Data

US 2013/0126951 A1 May 23, 2013

Related U.S. Application Data

(62) Division of application No. 12/569,689, filed on Sep. 29, 2009, now Pat. No. 8,357,569.

(51) Int. Cl.
| | |
|---|---|
| *H01L 29/78* | (2006.01) |
| *H01L 21/265* | (2006.01) |
| *H01L 29/66* | (2006.01) |

(52) U.S. Cl.
CPC .......... *H01L 29/78* (2013.01); *H01L 21/2652* (2013.01); *H01L 29/66795* (2013.01); *H01L 29/66803* (2013.01)

(58) Field of Classification Search
CPC  H01L 21/2652; H01L 29/66795; H01L 29/78
See application file for complete search history.

(56) References Cited

U.S. PATENT DOCUMENTS

| | | | |
|---|---|---|---|
| 6,706,571 B1 | 3/2004 | Yu et al. | |
| 6,821,834 B2 | 11/2004 | Ando | |
| 6,831,310 B1 * | 12/2004 | Mathew | H01L 27/108 257/270 |
| 6,853,020 B1 | 2/2005 | Yu et al. | |
| 6,858,478 B2 | 2/2005 | Chau et al. | |
| 7,056,781 B2 | 6/2006 | Yoon et al. | |
| 7,064,022 B1 * | 6/2006 | Hill | H01L 21/845 257/E21.345 |
| 7,190,050 B2 | 3/2007 | King et al. | |
| 7,247,887 B2 | 7/2007 | King et al. | |
| 7,265,008 B2 | 9/2007 | King et al. | |
| 7,508,031 B2 | 3/2009 | Liu et al. | |
| 7,528,465 B2 | 5/2009 | King et al. | |
| 7,605,449 B2 | 10/2009 | Liu et al. | |
| 7,667,271 B2 | 2/2010 | Yu et al. | |
| 7,701,008 B2 | 4/2010 | Yeo et al. | |
| 7,807,523 B2 | 10/2010 | Liu et al. | |
| 7,862,962 B2 | 1/2011 | Shieh et al. | |

(Continued)

*Primary Examiner* — Ori Nadav
*Assistant Examiner* — Ernest Allen, III
(74) *Attorney, Agent, or Firm* — Haynes and Boone, LLP

(57) ABSTRACT

The present disclosure provides a FinFET device and method of fabricating a FinFET device. The method includes providing a substrate, forming a fin structure on the substrate, forming a gate structure including a gate dielectric and gate electrode, the gate structure overlying a portion of the fin structure, forming a protection layer over another portion of the fin structure, and thereafter performing an implantation process to form source and drain regions.

20 Claims, 5 Drawing Sheets

(56) References Cited

U.S. PATENT DOCUMENTS

| | | |
|---|---|---|
| 7,898,037 B2 | 3/2011 | Chuang et al. |
| 7,910,453 B2 | 3/2011 | Xu et al. |
| 7,939,862 B2 | 5/2011 | Moroz et al. |
| 7,943,986 B2 | 5/2011 | Yang et al. |
| 7,960,232 B2 | 6/2011 | King et al. |
| 7,989,355 B2 | 8/2011 | Shieh et al. |
| 8,053,299 B2 | 11/2011 | Xu |
| 8,062,963 B1 | 11/2011 | van Dal |
| 8,153,493 B2 | 4/2012 | Lee |
| 8,169,024 B2 | 5/2012 | Cheng et al. |
| 8,212,295 B2 | 7/2012 | Liaw |
| 8,278,173 B2 | 10/2012 | Lim et al. |
| 8,278,196 B2 | 10/2012 | Huang et al. |
| 8,283,231 B2 | 10/2012 | Merelle et al. |
| 8,286,114 B2 | 10/2012 | Chuang et al. |
| 8,310,013 B2 | 11/2012 | Lin et al. |
| 8,338,305 B2 | 12/2012 | Chen et al. |
| 8,357,569 B2 | 1/2013 | Pawlak |
| 8,367,498 B2 | 2/2013 | Chang et al. |
| 8,373,229 B2 | 2/2013 | Chen et al. |
| 8,399,931 B2 | 3/2013 | Liaw et al. |
| 8,415,718 B2 | 4/2013 | Xu |
| 8,445,340 B2 | 5/2013 | Lee et al. |
| 8,466,490 B2 | 6/2013 | Liu et al. |
| 8,486,769 B2 | 7/2013 | Wang et al. |
| 8,525,267 B2 | 9/2013 | Wang et al. |
| 8,609,495 B2 | 12/2013 | Gan et al. |
| 8,621,398 B2 | 12/2013 | Shen et al. |
| 8,633,076 B2 | 1/2014 | Wang et al. |
| 8,675,397 B2 | 3/2014 | Liaw |
| 8,729,627 B2 | 5/2014 | Cheng et al. |
| 8,786,057 B2 | 7/2014 | King et al. |
| 2004/0108545 A1 | 6/2004 | Ando |
| 2006/0220133 A1 | 10/2006 | Yeo et al. |
| 2008/0111185 A1* | 5/2008 | Cheng ............ H01L 29/785 257/347 |
| 2008/0265321 A1* | 10/2008 | Yu ............ H01L 21/26586 257/344 |
| 2008/0290470 A1 | 11/2008 | King et al. |
| 2009/0035909 A1 | 2/2009 | Chang et al. |
| 2011/0042744 A1 | 2/2011 | Cheng et al. |
| 2011/0147846 A1 | 6/2011 | Su et al. |
| 2011/0282478 A1 | 11/2011 | Shen et al. |
| 2011/0317485 A1 | 12/2011 | Liaw |
| 2012/0009690 A1 | 1/2012 | Wann et al. |
| 2012/0012932 A1 | 1/2012 | Perng et al. |
| 2012/0104472 A1 | 5/2012 | Xu et al. |

* cited by examiner

METHOD OF FABRICATING FINFET DEVICE AND STRUCTURE THEREOF

PRIORITY DATA

The present application is a divisional application of U.S. patent application Ser. No. 12/569,689, filed Sep. 29, 2009, which is incorporated herein by reference in its entirety.

BACKGROUND

The present disclosure relates generally to the field of fabrication of semiconductor devices, and more specifically to a method of fabricating a fin type field effect transistor (FinFET) or portion thereof.

As the semiconductor industry has progressed into nanometer technology process nodes in pursuit of higher device density, higher performance, and lower costs, challenges from both fabrication and design issues have resulted in the development of three dimensional designs, such as a fin-like field effect transistor (FinFET). A typical FinFET is fabricated with a thin 'fin' extending from a substrate, for example, etched into a silicon layer of the substrate. The channel of the FET is formed in this vertical fin. A gate is provided over (e.g., wrapping) the fin. It is beneficial to have a gate on both sides of the channel allowing gate control of the channel from both sides. Further advantages of FinFETs include reducing the short channel effect and higher current flow.

There have been problems associated with fabrication of FinFETs as device structures become more dense. For example, dense structures of FinFET architecture require a lower implant tilt angle and a higher implant energy in order to provide a proper dose collection efficiency on the FinFET side wall. However, the higher implant energy may increase amorphization of the fin even under the gate which will degrade the performance of the FinFET.

As such, an improved FinFET device and fabrication method of a FinFET device is desired.

SUMMARY

One of the broader forms of an embodiment of the present invention involves a method of fabricating a FinFET device. The method includes providing a substrate; forming a fin structure on the substrate; forming a gate structure including a gate dielectric and gate electrode, the gate structure overlying a portion of the fin structure; forming a protection layer over another portion of the fin structure; and thereafter performing an implantation process to form source and drain regions.

Another one of the broader forms of an embodiment of the present invention involves a method of fabricating a FinFET device. The method includes providing a substrate; forming a silicon fin on the substrate; forming a gate structure on a portion of the silicon fin; forming a protective oxide layer on another portion of the silicon fin; and thereafter implanting ions to form a source region and a drain region.

Yet another one of the broader forms of an embodiment of the present invention involves a FinFET device. The FinFET device includes a substrate; a fin structure disposed on the substrate; a gate structure disposed on a portion of the fin structure; a protection layer disposed on another portion of the fin structure; and source and drain regions disposed at either side of the fin structure. The protection layer includes dopants that were implanted when forming the source and drain regions.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to semiconductor devices and more particularly, to a FinFET device and method of fabricating a FinFET device or portion of a device. It is understood, however, that specific embodiments are provided as examples to teach the broader inventive concept, and one of ordinary skill in the art can easily apply the teaching of the present disclosure to other methods or apparatus. In addition, it is understood that the methods and apparatus discussed in the present disclosure include some conventional structures and/or processes. Since these structures and processes are well known in the art, they will only be discussed in a general level of detail. Furthermore, reference numbers are repeated throughout the drawings for sake of convenience and example, and such repetition does not indicate any required combination of features or steps throughout the drawings. Moreover, the formation of a first feature over and on a second feature in the description that follows may include embodiments in which the first and second features are formed in direct contact, and may also include embodiments in which additional features may be formed interposing the first and second features, such that the first and second features may not be in direct contact.

Figure 1:
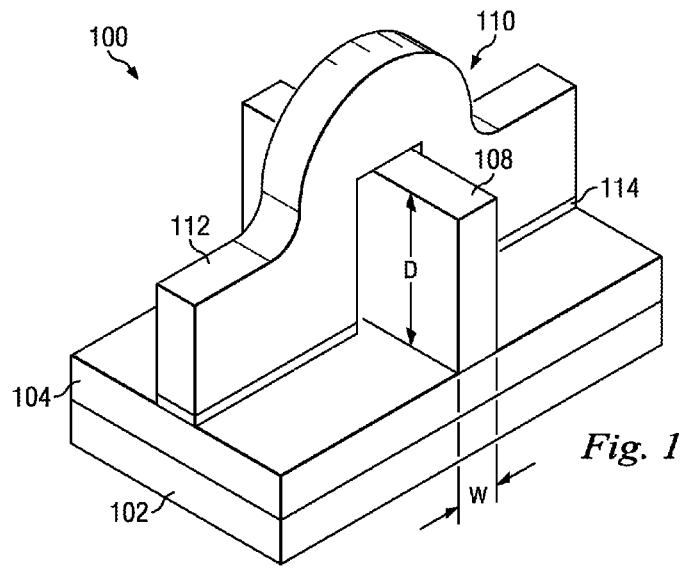
FIG. 1 illustrates a perspective view of an embodiment of a FinFET device according to various aspects of the present disclosure.

Referring to FIG. 1, illustrated is a perspective view of an embodiment of a FinFET device 100. The FinFET device 100 or a portion thereof may be formed using a method 200 described below with reference to FIG. 2. The FinFET device includes a substrate 102, an insulator layer 104, a fin structure 108, and a gate structure 110. In an embodiment, the substrate 102 includes a silicon substrate. The substrate 102 may be silicon in a crystalline structure. In other embodiments, the substrate 102 may include other elementary semiconductors such as germanium, or include a compound semiconductor such as, silicon carbide, gallium arsenide, indium arsenide, and indium phosphide. In an embodiment, the substrate 102 includes a silicon-on-insulator (SOI) substrate. The SOI substrate may be fabricated using separation by implantation of oxygen (SIMOX), wafer bonding, and/or other suitable methods. The substrate 102 may include isolation regions, doped regions, and/or other features as is known in the art.

The insulator layer 104 is disposed on the substrate 102. In an embodiment, the insulator layer 104 is silicon oxide. The insulator layer 104 may be a buried oxide (BOX) layer.

The insulator layer 104 may be a component (e.g., layer) of an SOI substrate. The insulator layer 104 may be formed using processes such as, implantation (e.g., SIMOX), oxidation, deposition, and/or suitable processes.

In an embodiment, the fin structure 108 includes silicon. In other embodiments, the fin structure 108 may optionally include germanium. The fin structure 108 may be disposed on the insulator layer 104. The fin structure 108 may have a depth (D) ranging from about 100 to about 1000 Angstroms, and a width (W) ranging from about 10 to about 20 nm. It is understood that although one fin structure is illustrated multiple parallel fins may be formed in a similar manner.

The gate structure 110 is formed on a portion of the fin structure 108. The gate structure 110 includes a gate dielectric layer 114 and a gate electrode 112. It is understood that numerous other layers may also be present, for example, capping layers, interface layers, spacer elements, and/or other suitable features. In an embodiment, the gate dielectric layer 114 may include silicon oxide. The silicon oxide may include a thickness ranging from about 1 to about 3 nm. In other embodiments, the gate dielectric layer 114 may optionally include other dielectric materials such as, silicon nitride, silicon oxinitride, dielectric with a high dielectric constant (high k), and/or combinations thereof. Examples of high k materials include hafnium silicate, hafnium oxide, zirconium oxide, aluminum oxide, hafnium dioxide-alumina ($HfO_2$—$Al_2O_3$) alloy, and/or combinations thereof. The gate electrode 112 may include polysilicon, silicon-germanium, a metal including metal compounds such as, Mo, Cu, W, Ti, Ta, TiN, TaN, NiSi, CoSi, and/or other suitable conductive materials known in the art.

The fin structure 108 may include a channel of the FinFET device 100. The fin structure 108 may be doped to provide a suitable channel for an N-type FinFET (NMOS device) or P-type FinFET (PMOS device). The fin structure 108 may include suitable dopants such as, p-type dopants (e.g., boron or indium) and/or n-type dopants (e.g., arsenic or phosphorous). The fin structure 108 may be doped using processes such as, ion implantation, diffusion, annealing, and/or other suitable processes. The fin structure 108 may include and/or be coupled to source and drain regions (not shown) associated with the FinFET device 100. The FinFET device 100 may be a device included in a microprocessor, memory cell, and/or other integrated circuits.

Figure 2:
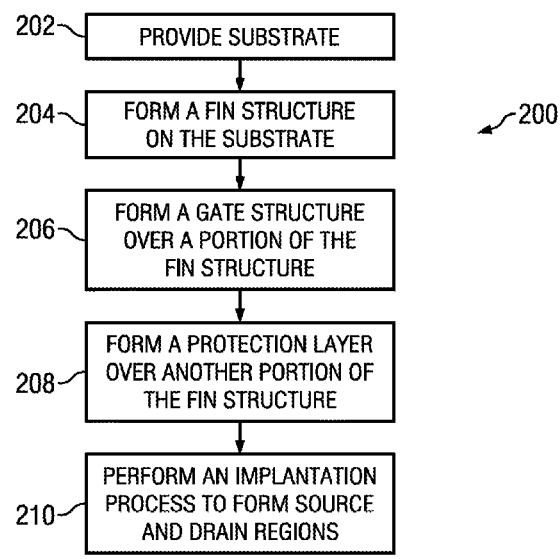
FIG. 2 illustrates a flowchart of a method of fabricating a FinFET device according to various aspects of the present disclosure.
Figure 3:
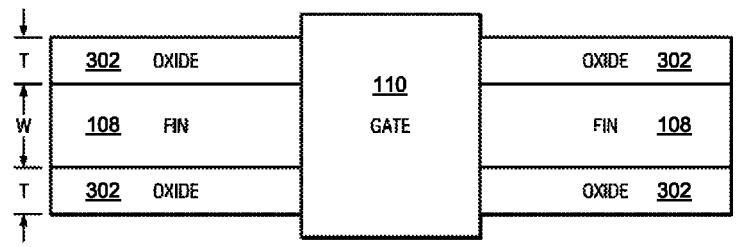
FIGS. 3 and 4 illustrate top and cross-sectional views, respectively, of a portion the FinFET device at various stages of fabrication according to the method of FIG. 2.
Figure 4:
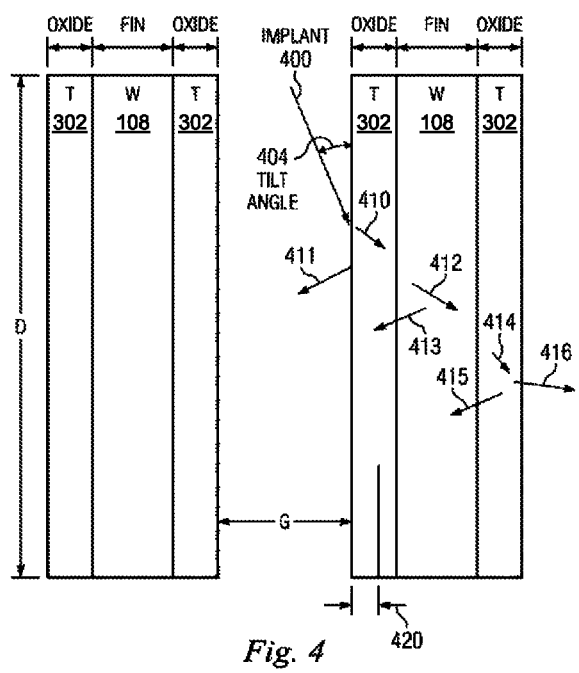

Referring to FIG. 2, illustrated is an embodiment of a method 200 of fabricating a FinFET device such as the FinFET device 100 of FIG. 1. Referring also to FIGS. 3 and 4, illustrated are a top view and cross-sectional view, respectively, of a portion of the FinFET device at various stages of fabrication according to the method 200 of FIG. 2. It is understood that FIGS. 3 and 4 have been simplified for a better understanding of the inventive concepts of the present disclosure. Further, various other processes may be provided before, during, and after the method 200, and some processes may only be briefly described herein.

The method 200 begins with block 202 in which a substrate is provided. In an embodiment, the substrate includes a silicon substrate (e.g., wafer). The substrate may be silicon in a crystalline structure. In other embodiments, the substrate may include other elementary semiconductors such as germanium, or include a compound semiconductor such as, silicon carbide, gallium arsenide, indium arsenide, and indium phosphide. In an embodiment, the substrate includes a silicon-on-insulator (SOI) substrate. The SOI substrate may be fabricated using separation by implantation of oxygen (SIMOX), wafer bonding, and/or other suitable methods.

The method 200 continues with block 204 in which a fin structure is formed on the substrate. In an embodiment, the fin structure is a silicon fin (Si-fin). The fin structure may be formed, for example, by etching a layer of silicon on the substrate. The layer of silicon may be a silicon layer of an SOI substrate (e.g., overlying an insulator layer). The fin structure may be fabricated by patterning a silicon layer overlying the insulator layer (e.g., an upper silicon layer of a silicon-insulator-silicon stack of an SOI substrate). The fin structure may include a capping layer disposed on the fin. In an embodiment, the capping layer is a silicon layer. The fin structure 108 may have a depth ranging from about 100 to about 1000 Angstroms, and a width ranging from about 10 to about 20 nm. In FIGS. 3 and 4, the fin structure (FIN) has a width (W) of about 10 nm in an embodiment.

The fin structure may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. The masking element may then be used to etch the fin structure into the silicon layer. The fin structure may be etched using reactive ion etch (RIE) and/or other suitable processes. It is understood that multiple parallel fin structures may be formed in a similar manner.

In an embodiment, the fin structure may be formed by double-patterning lithography (DPL) process. DPL is a method of constructing a pattern on a substrate by dividing the pattern into two interleaved patterns. DPL allows enhanced feature (e.g., fin) density. Various DPL methodologies may used including, double exposure (e.g., using two mask sets), forming spacers adjacent features and removing the features to provide a pattern of spacers, resist freezing, and/or other suitable processes.

The method 200 continues with block 206 in which a gate structure 110 is formed over a portion of the fin structure 108. In FIG. 3, the gate structure 110 (GATE) is formed over a central portion of the fin structure 108. The gate structure 110 includes a gate dielectric layer and a gate electrode. In an embodiment, the gate dielectric layer may include silicon oxide. The silicon oxide may include a thickness ranging from about 1 to about 3 nm. In other embodiments, the gate dielectric layer may optionally include other dielectric materials such as, silicon nitride, silicon oxinitride, dielectric with a high dielectric constant (high k), and/or combinations thereof. Examples of high k materials include hafnium silicate, hafnium oxide, zirconium oxide, aluminum oxide, hafnium dioxide-alumina ($HfO_2$—$Al_2O_3$) alloy, and/or combinations thereof. The gate dielectric layer may be formed using processes such as, photolithography patterning, oxidation, deposition, etching, and/or other suitable processes. The gate electrode may include polysilicon, silicon-germanium, a metal including metal compounds such as, Mo, Cu, W, Ti, Ta, TiN, TaN, NiSi, CoSi, and/or other suitable conductive materials known in the art. The gate electrode may be formed using processes such as, physical vapor deposition (PVD), chemical vapor deposition (CVD), plasma-enhanced chemical vapor deposition (PECVD), atmospheric pressure chemical vapor deposition (APCVD), low-pressure CVD (LPCVD), high density plasma CVD (HD CVD), atomic layer CVD (ALCVD), and/or other suitable processes which may be followed, for example, by photolithography and/or etching processes.

The method 200 continues with block 208 in which a protection layer 302 is formed over another portion of the fin structure 108. The protection layer 302 is formed over the portions of the fin structure 108 that are not covered by the gate structure 110. In FIGS. 3 and 4, the protection layer 302 includes silicon oxide. The silicon oxide layer is formed by a low temperature process such as low-temperature CVD. Alternatively, the silicon oxide layer may optionally be formed by plasma enhanced CVD (PECVD) and eventually low temperature thermal oxidation. In an embodiment, the temperature is less than about 850° C. In other embodiments, the temperature is less than about 700° C. The thickness of the silicon oxide layer may range from about 3 to about 10 nm. In some embodiments, the thickness of the silicon oxide layer ranges from about 5 to about 6 nm. In FIGS. 3 and 4, the thickness (T) of the silicon oxide protection layer 302 is about 5 nm in an embodiment. The silicon oxide protection layer 302 covers the sidewalls and optionally top portion (not shown) of the fin structure 108. It has been observed that the silicon oxide layer is compatible with the silicon and thus, contamination of the silicon fin structure 108 may be prevented. Alternatively, the protection layer 302 may optionally include silicon nitride, silicon oxynitride, or amorphous carbon.

It should be noted that in situations where silicon oxide is used as the gate dielectric, the thickness of gate dielectric may not be sufficient to function as a protection layer 302 for the ion implantation process. Accordingly, the protection layer 302 is typically not formed with the gate dielectric but formed after formation of the gate structure 110. Further, the protection layer 302 may be formed prior to the formation of gate spacers (not shown). It should also be noted that the silicon oxide protection layer 302 serves as (1) a protection against ion implantation related crystal damage, and thus the lower the damage the better device performance, (2) a protection against strip when fabricating CMOS: PMOS and NMOS devices. For example, implantation of p-type dopants (e.g., B) is followed by a strip of the resist, which can remove near surface dopants. The protection layer 302 will minimize the strip related dopant removal. And vice versa for implantation of n-type dopants (e.g., As or P), the implant will be followed by resist strip. The resist strip may remove the dopants. Thus, the protection layer 302 will prevent dopant removal from the silicon.

The method 200 continues with block 210 in which an implantation process is performed to form source and drain regions. In FIG. 4, an ion implantation process 400 is performed to form source and drain regions of the FinFET. The ion implantation process utilizes a tilt angle 404 greater than 10 degrees, and may range from about 10 to about 20 degrees, up to 45 degrees in some cases. The tilt angle 404 may depend on a depth (D) of the fin structure 108 and a gap or spacing (G) to an adjacent fin structure 108. For example, as the depth increases and the gap (G) decreases (e.g., higher density structures), the tilt angle 404 will decrease to account for shadowing effects. Accordingly, a lower tilt angle 404 may causes low dose collection efficiency on the sidewall of the fin structure 108. Thus, the ion implantation process 400 may utilize a higher implant energy as compared to an implantation process that utilizes higher tilt angles. Further, the ion implantation process 400 may utilize a higher implant energy due to the blocking effect of the silicon oxide protection layer 302. In an embodiment, the ion implantation process utilizes an implant energy ranging from about 3 to about 20 KeV. Selection of an implant energy will be explained in more detail below. The ion implantation process 400 may utilize a dosage of about 1E15 atoms/cm². The ion implantation process 400 may utilize a p-type dopant (e.g., B, BF$_2$, In) or an n-type dopant (e.g., As, P) depending on the desired conductivity type of the source and drain regions.

In FIG. 4, the ion implantation process 400 implants ions into the silicon oxide layer which causes scattering and retention of ions 410 inside the silicon oxide layer. There may be some out-scattering of ions 411 from the silicon oxide layer. Ions may continue into the fin structure 108 (FIN) which causes scattering and retention of ions 412 inside the silicon fin. There may be some back-scattering of ions 413 to the silicon oxide layer. Ions may continue into the silicon oxide layer which causes scattering and retention of ions 414 inside the silicon oxide layer. There may be some back scattering 415 to the silicon fin and some pass-through 416. It has been observed the silicon oxide layer exhibits an amorphous depth 420 after the ion implantation process. Accordingly, the silicon oxide layer helps protect the silicon fin from the higher implant energy and minimizes amorphization of the silicon fin. An annealing such as rapid thermal annealing (RTA) may be performed for dopant activation such that dopants will be indiffused from the silicon oxide layer to the silicon fin.

The method 200 may continue to provides steps fabricating other features of FinFET elements, including, for example, forming contact, interconnect structures, and/or other suitable processes and features. In an embodiment, the silicon oxide protection layer 302 may be removed after the ion implantation process. In other embodiments, the silicon oxide protection layer 302 may remain over the fin structure 108 in the final device.

Referring to FIGS. 5-9 illustrated are various graphs depicting structural characteristics of a fin structure being fabricated according to the method 200 of FIG. 2. The fin structure includes a silicon oxide/silicon/silicon oxide (SiO$_2$/Si/SiO$_2$) cross sectional configuration. The silicon oxide/silicon/silicon oxide fin structure is similar to the fin structure shown in FIG. 4. Accordingly, the silicon oxide layer has a thickness of about 5 nm (formed on both sidewalls of the fin) and the Si fin has a width of about 10 nm. From the various graphs of FIGS. 5-9, one can select a proper implant energy to minimize amorphization of the silicon layer of the silicon oxide/silicon/silicon oxide fin structure while providing sufficient dopant concentration for source and drain regions of the FinFET. It is understood that other parameters of the implantation process such as tilt angle, dosage, dopant, may also be tuned to achieve similar performance characteristics of the FinFET.

Figure 5:
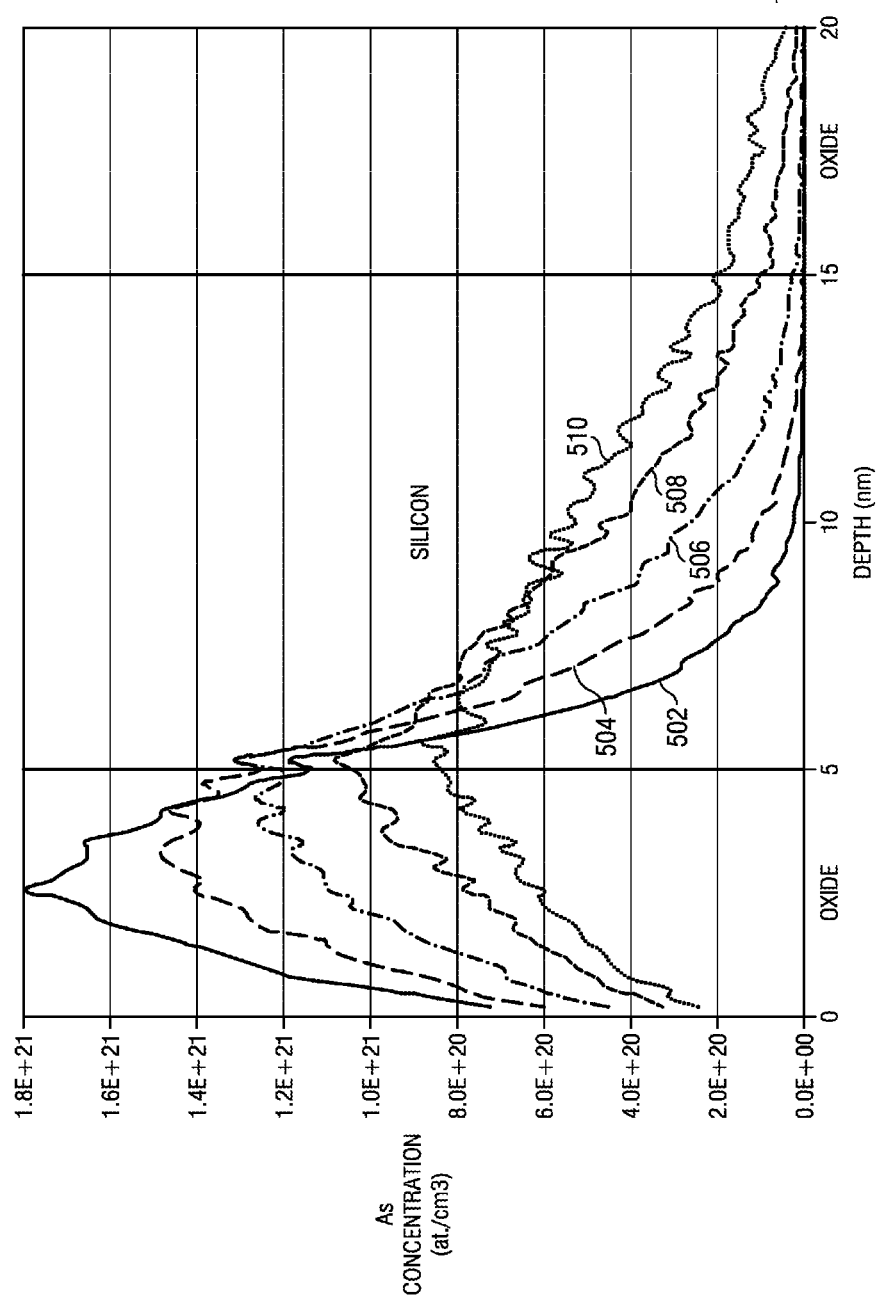
FIGS. 5-9 illustrate various graphs depicting structural characteristics of a FinFET device fabricated according to the method of FIG. 2.

In FIG. 5, a graph 500 depicts a relationship between a dopant concentration (atoms/cm³) and a depth (nm) of the silicon oxide/silicon/silicon oxide fin structure after an ion implantation process. In graph 500, the depth is measured across the fin structure (as shown in FIG. 4) such that from 0 to 5 nm corresponds to the silicon oxide layer (oxide), from 5 to about 15 corresponds to the Si layer (silicon), and from 15 to 20 nm corresponds to the silicon oxide layer (oxide). The ion implantation process utilizes As dopant, a tilt angle of 70 degrees, and various implant energies. Lines 502, 504, 506, 508, and 510 depict implant energies of 5 KeV, 7 KeV, 10 KeV, 15 KeV, and 20 KeV, respectively. From the graph 500, it has been observed that even at a high tilt angle of 70 degrees, the ion implantation process is capable of implanting significant amounts of dopants inside the silicon layer of the silicon oxide/silicon/silicon oxide fin structure.

Figure 6:
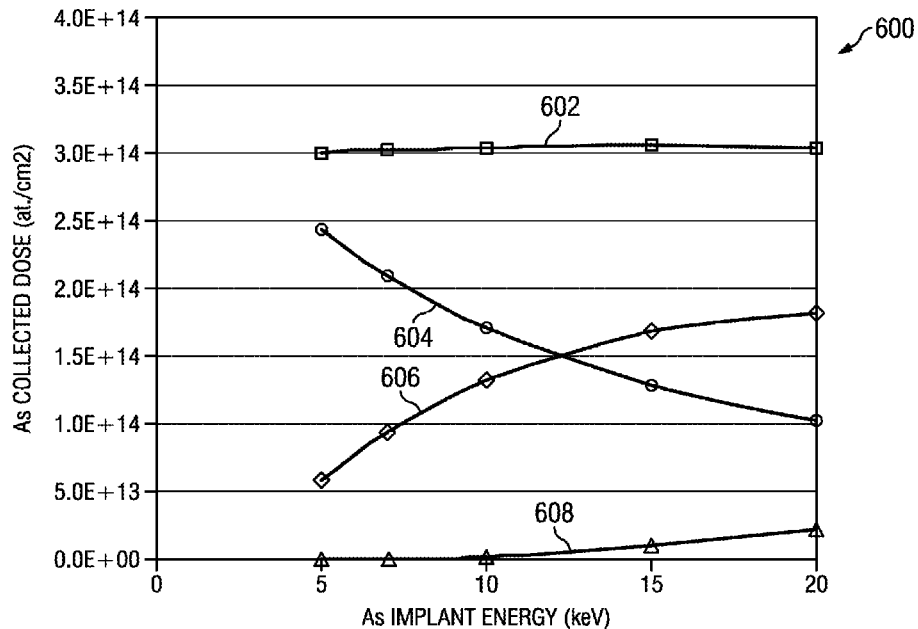

Referring to FIG. 6, a graph 600 depicts a relationship between a collected dosage (atoms/cm²) and an implant energy (KeV). The ion implantation process utilizes As dopants, a tilt angle of about 20 degrees, and a dosage of about 1E15 atoms/cm². The ion implantation process further utilizes implant energies of 5 KeV, 7 KeV, 10 KeV, 15 KeV, and 20 KeV to measure the collected dosage. In graph 600, line 602 corresponds to the collected dosage in a silicon fin structure without a silicon oxide protection layer. Line 604 corresponds to the collected dosage in the silicon oxide layer at one sidewall of the silicon oxide/silicon/silicon oxide fin structure. Line 606 corresponds to the collected dosage in the silicon layer of the silicon oxide/silicon/silicon oxide fin structure. Line 608 corresponds to the collected dosage in the silicon oxide layer at the other sidewall of the silicon oxide/silicon/silicon oxide fin structure. From line 606 of graph 600, it has been observed that even at a low tilt angle of 20 degrees, the ion implantation process is capable of implanting significant amounts of dopants inside the silicon of the silicon oxide/silicon/silicon oxide fin structure by increasing the implant energy.

Figure 7:
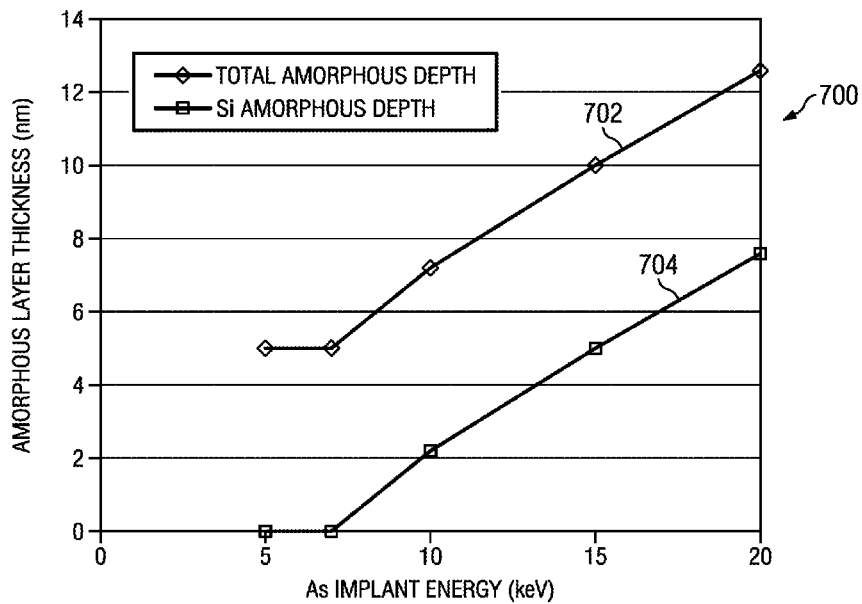

Referring to FIG. 7, a graph 700 depicts a relationship between an amorphous layer thickness (nm) of a silicon layer and an implant energy (KeV). The amorphous layer thickness corresponds to the amount of amorphization on one side of the fin structure due to the ion implantation process. The ion implantation process utilizes As dopants, a tilt angle of about 20 degrees, and a dosage of about 1E15 atoms/cm². The ion implantation process further utilizes implant energies of 5 KeV, 7 KeV, 10 KeV, 15 KeV, and 20 KeV to amorphous layer thickness. In graph 700, line 702 corresponds to a total amorphous depth of the silicon oxide/silicon/silicon oxide fin structure. Line 704 corresponds to an amorphous depth of silicon of the silicon oxide/silicon/silicon oxide fin structure. From the graph 700, it has been observed that a proper implant energy may be selected to achieve a high dose retention inside the fin structure while limiting amorphization of the silicon fin.

Figure 8:
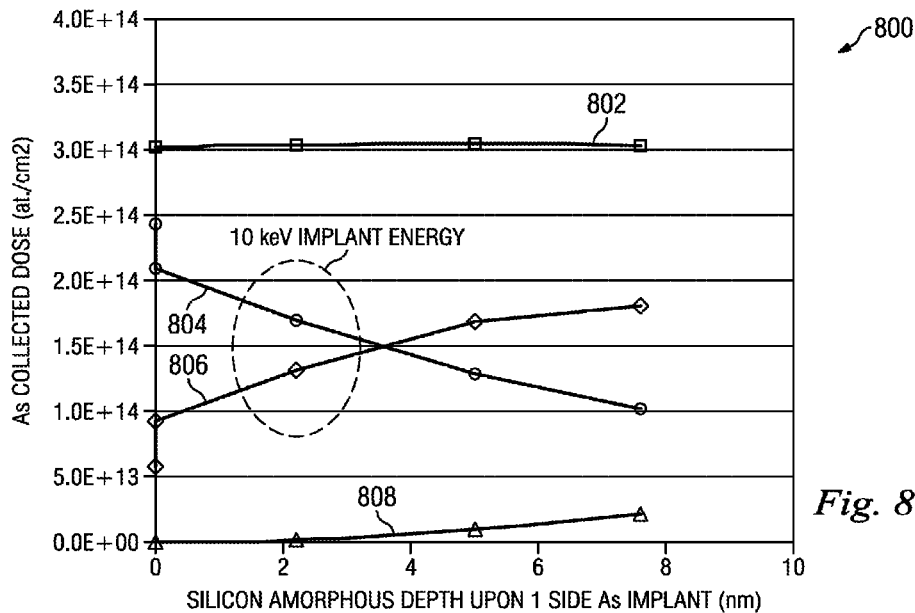

Referring to FIG. 8, a graph 800 depicts a relationship between a collected dosage (atoms/cm²) and a silicon amorphous depth (nm) for various implant energies. The ion implantation process utilizes As dopants, a tilt angle of about 20 degrees, and a dosage of about 1E15 atoms/cm². The ion implantation process further utilizes implant energies of 5 KeV, 7 KeV, 10 KeV, 15 KeV, and 20 KeV to measure the collected dosage and silicon amorphous depth. In graph 800, line 802 corresponds to the collected dosage in a silicon fin structure without a silicon oxide protection layer. Line 804 corresponds to the collected dosage in the silicon oxide layer at one sidewall of the silicon oxide/silicon/silicon oxide fin structure. Line 806 corresponds to the collected dosage in the silicon layer of the silicon oxide/silicon/silicon oxide fin structure. Line 808 corresponds to the collected dosage in the silicon oxide layer at the other sidewall of the silicon oxide/silicon/silicon oxide fin structure. From graph 800, an implant energy of 10 KeV may be selected to provide a high dose retention in the silicon (e.g., collected dosage of about 1.3E14 atoms/cm²) and limiting amorphization of the silicon (e.g., silicon amorphous depth about 2 nm) upon one side implant.

Figure 9:
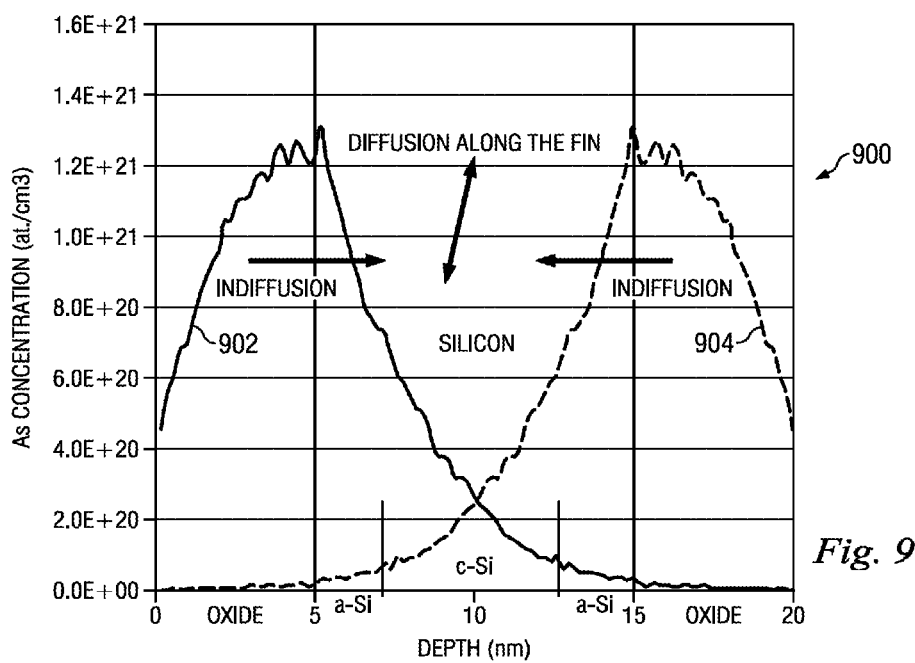

Referring to FIG. 9, a graph 900 depicts a relationship between a dopant concentration (atoms/cm³) and a depth (nm) of the silicon oxide/silicon/silicon oxide fin structure following an ion implantation process selected based on the graphs 500, 600, 700, 800 of FIGS. 5-8, respectively. In graph 900, the depth is measured across the silicon oxide/silicon/silicon oxide fin structure (as shown in FIG. 4) such that from 0 to 5 nm corresponds to the silicon oxide layer (oxide), from 5 to about 15 corresponds to the Si layer (silicon), and from 15 to 20 nm corresponds to the silicon oxide layer (oxide). The ion implantation process may be performed on both sidewalls of the fin structure. Accordingly, line 902 corresponds to the implantation process on one side of the fin structure and line 904 corresponds to the implantation process on the other side of the fin structure. The selected ion implantation process includes As dopants, a tilt angle of about 20 degrees, a dosage of about 1E15 atoms/cm², and an implant energy of about 10 KeV. From the graph 900, the silicon fin includes amorphous silicon (α-Si) with a depth of about 2 nm on either sidewall and crystalline silicon (c-Si) in a central portion of the fin structure. The dopants in the silicon oxide layer (oxide) may diffuse into the silicon layer, and the dopants in the silicon layer (silicon) may diffuse along the fin structure. Thus, the ion implantation process can be selected to achieve a sufficiently high dopant concentration in the silicon layer (for source and drain implant) and limit the amorphization of the silicon fin thereby improving device performance.

Although only a few exemplary embodiments of this invention have been described in detail above, those skilled in the art will readily appreciate that many modifications are possible in the exemplary embodiments without material departing from the novel teachings and advantages of this disclosure. For example, the protection layer has been described mainly in terms of silicon oxide and in many instances $SiO_2$. However, one skilled in the art may appreciate that other materials may be used to achieve the protection sought. Because in some cases the protection layer is removed after implanting, the nature of the protection layer would have little impact on the operation of the actual final device.

What is claimed is:
1. A FinFET device, comprising:
   a substrate;
   a fin disposed on the substrate;
   a gate structure disposed on a portion of the fin;
   a first protection layer and a second protection layer disposed adjacent the fin,
   wherein each of the first protection layer and the second protection layer is disposed adjacent to portions of the fin that are not covered by the gate structure,
   wherein the first protection layer directly physically contacts a first side of the fin and a the second protection layer directly physically contacts an opposite second side of the fin, and
   wherein the fin has a dopant concentration that increases from a plane oriented parallel to a current flow that vertically bisects the fin towards an interface between the first protection layer and the first side and that increases from the plane towards an interface between the second protection layer and the second side; and
   source and drain regions disposed at either end of the fin.
2. The device of claim 1, wherein the first protection layer and the second protection layer each include silicon oxide having a thickness ranging from about 3 to about 10 nm.
3. The device of claim 2, wherein the gate structure includes a gate oxide having a thickness less than the thicknesses of the first protection layer and the second protection layer.
4. The device of claim 1, wherein the fin includes a silicon fin having a thickness ranging from about 10 to about 20 nm.
5. A FinFET device comprising:
   a fin formed on a substrate, the fin including a first sidewall and an opposite second sidewall, the fin including a dopant that has concentrations at the first sidewall and the second sidewall that are greater than a concentration of the dopant at a plane oriented parallel to a current flow that vertically bisects the fin;
a gate structure formed over the fin;
a first protection layer physically contacting a portion of the first sidewall of the fin that is not covered by the gate structure;
a second protection layer physically contacting a portion of the second sidewall of the fin that is not covered by the gate structure; and
source and drain regions formed in the fin at either side of the gate structure.

6. The FinFET device of claim 5, wherein the first protection layer and the second protection layer each include one of silicon oxide and an amorphous carbide material.

7. The FinFET device of claim 5, wherein the fin is formed of silicon and includes an amorphous silicon portion and a crystal silicon portion.

8. The FinFET device of claim 5, wherein the source and drain regions include the dopant.

9. A FinFET device, comprising:
a fin formed on a substrate, the fin including a first sidewall, and a second sidewall opposite the first sidewall, the fin including a dopant having a greater concentration at the first sidewall and the second sidewall than at a midpoint equidistant between the first sidewall and the second sidewall;
a gate structure formed over the fin;
a first protection layer containing the dopant disposed on the first sidewall; and
a second protection layer containing the dopant disposed on the second sidewall,
wherein the first protection layer and the second protection layer are adjacent portions of the fin that are not covered by the gate structure.

10. The FinFET device of claim 9, wherein a concentration level of the dopant within the second protection layer increases across the first protection layer towards the fin, and
wherein a concentration level of the dopant increases across the second portion of the protection layer towards the fin.

11. The device of claim 1, wherein the dopant concentration of the fin increases substantially continuously from the plane to the interface between the first protection layer and the first side and increases substantially continuously from the plane to the interface between the second protection layer and the second side.

12. The device of claim 1, wherein the dopant concentration of the fin has a minimum concentration at the plane.

13. The device of claim 1, wherein a dopant concentration of the first protection layer has a lowest concentration at a surface of the first protection layer opposite the fin and a dopant concentration of the second protection layer has a lowest concentration at a surface of the second protection layer opposite the fin.

14. The device of claim 1, wherein the first protection layer and the second protection layer each include a material selected from a group consisting of: silicon nitride, silicon oxynitride, and amorphous carbon.

15. The FINFET device of claim 5, wherein the concentration of the dopant at the plane is a minimum concentration of the dopant within the fin.

16. The FINFET device of claim 5, wherein the dopant within the fin increases in concentration substantially consistently from the plane to the first sidewall and from the plane to the second sidewall.

17. The FINFET device of claim 5, wherein a concentration of the dopant within the first protection layer has a minimum concentration at a surface of the first protection layer opposite the fin.

18. The FINFET device of claim 9, wherein the fin further has a minimum concentration of the dopant at the midpoint equidistant between the first sidewall and the second sidewall.

19. The FINFET device of claim 9, wherein a concentration of the dopant within the fin increase substantially consistently from the midpoint to the first sidewall and from the midpoint to the second sidewall.

20. The FINFET device of claim 9, wherein each of the first protection layer and the second protection layer includes a material selected from a group consisting of: silicon nitride, silicon oxynitride, and amorphous carbon.

* * * * *